United States Patent [19]

Niklos

[11] Patent Number: 5,528,454

[45] Date of Patent: Jun. 18, 1996

[54] COOLING DEVICE FOR ELECTRONIC COMPONENTS ARRANGED IN A VERTICAL SERIES AND VERTICAL SERIES OF ELECTRONIC DEVICES CONTAINING SAME

[75] Inventor: John R. Niklos, Worthington, Ohio

[73] Assignee: CompuServe Incorporated, Columbus, Ohio

[21] Appl. No.: 365,683

[22] Filed: Dec. 29, 1994

[51] Int. Cl.$^6$ ..................................................... H05K 7/20
[52] U.S. Cl. ........................... 361/695; 165/122; 361/687
[58] Field of Search ........................... 454/184; 165/122, 165/126, 127, 80.3; 134/15.1, 16.1; 361/687, 690, 694, 695, 719–721

[56] References Cited

U.S. PATENT DOCUMENTS

| | | | |
|---|---|---|---|
| 3,559,728 | 2/1971 | Lyman | 165/122 |
| 4,149,218 | 4/1979 | Carrubba | 361/383 |
| 4,233,644 | 11/1980 | Hwang | 361/697 |
| 4,500,944 | 2/1985 | Roberts | 361/697 |
| 5,135,046 | 8/1992 | Becquerel | 165/43 |
| 5,276,584 | 1/1994 | Collins | 361/718 |
| 5,297,005 | 3/1994 | Gourdine | 361/697 |

*Primary Examiner*—Gerald P. Tolin
*Attorney, Agent, or Firm*—Standley & Gilcrest

[57] ABSTRACT

The present invention is a cooling device for a vertical array of electronic devices, which, in broadest terms, comprises an enclosure having a top and a bottom, each having at least one opening, and having first and second sides. The first opposing side has at least one first aperture and at least one first fan disposed in it to urge air toward the outside of the enclosure. The second opposing side has at least one second aperture and at least one second fan disposed in it adapted to urge air toward the inside of the enclosure. The device also has at least one deflector adapted to guide air passing through the opening(s) in the bottom of the enclosure toward the first fan(s), and adapted to guide air passing through the second fan(s) toward the opening(s) in the top of the enclosure.

2 Claims, 3 Drawing Sheets

COOLING DEVICE FOR ELECTRONIC COMPONENTS ARRANGED IN A VERTICAL SERIES AND VERTICAL SERIES OF ELECTRONIC DEVICES CONTAINING SAME

TECHNICAL FIELD

The present invention relates to a cooling device for electronic components arranged in a vertical series, and a vertical series of electronic devices containing same.

BACKGROUND OF THE INVENTION

In the use of electronic components, heat is typically generated.

Heat often has a negative effect of the performance of electronic components as it can adversely affect the conductive, resistive, capacitance and inductive properties of electrical circuitry. Over time, heat can degrade electronic components mid reduce their useful lives.

Heat also causes convection to occur which can direct heated air vertically. When arranged in a vertical relay, heated air escaping from those electronic components relatively lower in the array moves upward to further warm those components relatively higher in the array. This additive heating effect often can result in those components relatively higher in the array reaching temperatures much higher than preferred for optimum operation.

Another negative effect of convection is that the movement of air through the components can carry dust and other airborne contaminants through the array of electronic components.

It is therefore an object of the present invention to provide a cooling device that can be conveniently installed and used in a vertical array of electronic components to efficiently dissipate heat.

It is also an object of the present invention to provide a cooling device that diminishes the amount of dust and other airborne contaminants through an array of electronic components.

In view of the present disclosure and/or through practice of the present invention, other advantages, and the solutions to other problems, may become apparent.

SUMMARY OF THE INVENTION

The present invention is a cooling device for a vertical array of electronic devices, which, in broadest terms, comprises an enclosure having a top and a bottom, each having at least one opening, and having first and second sides. The first opposing side has at least one first aperture and at least one first fan disposed in it to urge air toward the outside of the enclosure. The second opposing side has at least one second aperture and at least one second fan disposed in it adapted to urge air toward the inside of the enclosure. The device also has at least one deflector adapted to guide air passing through the opening(s) in the bottom of the enclosure toward the first fan(s), and adapted to guide air passing through the second fan(s) toward the opening(s) in the top of the enclosure.

The enclosure may be constructed of any dimensionally stable material appropriate for use with the subject electrical devices, such as sheet metal or plastic. The enclosure may be constructed of one or more individual pieces.

The apertures may be cut, molded or stamped into the material from which it is made accordance with practices known in the metal-working and plastic-molding arts.

The fans used hi accordance with the present invention may be any chosen from, the type typically used to cool electronic equipment, such as those found on computers and similar electronic devices.

The deflector(s) may be of any geometry adapted for the given purpose. Typically, the deflector comprises a plate member disposed in the enclosure at an angle and extending from below the second fan(s) to above the first fan(s). The deflector(s) may be made of the same materials as described with respect to the enclosure.

The invention also includes a vertical array of electronic devices having at least one cooling device as described above, where the array comprises at least one upper electronic device; at least one lower electronic device; and a cooling device disposed between the upper electronic device(s) and the lower electronic device(s) in the vertical array of electronic devices.

The electronic devices used in accordance with the present invention may be of any type. Such devices may include amplifiers, modems, receivers, transceivers, tuners, etc.

It is preferred that the enclosure be of the same width and depth dimensions as the electronic devices so as best to fit into the vertical array. Such a preferred fit best conducts the air through the array and gives a more uniform aesthetic appearance.

DETAILED DESCRIPTION OF THE PREFERRED EMBODIMENT

In accordance with the foregoing summary, the following is a description of one embodiment of the present invention which is considered to be the best mode.

Figure 1:
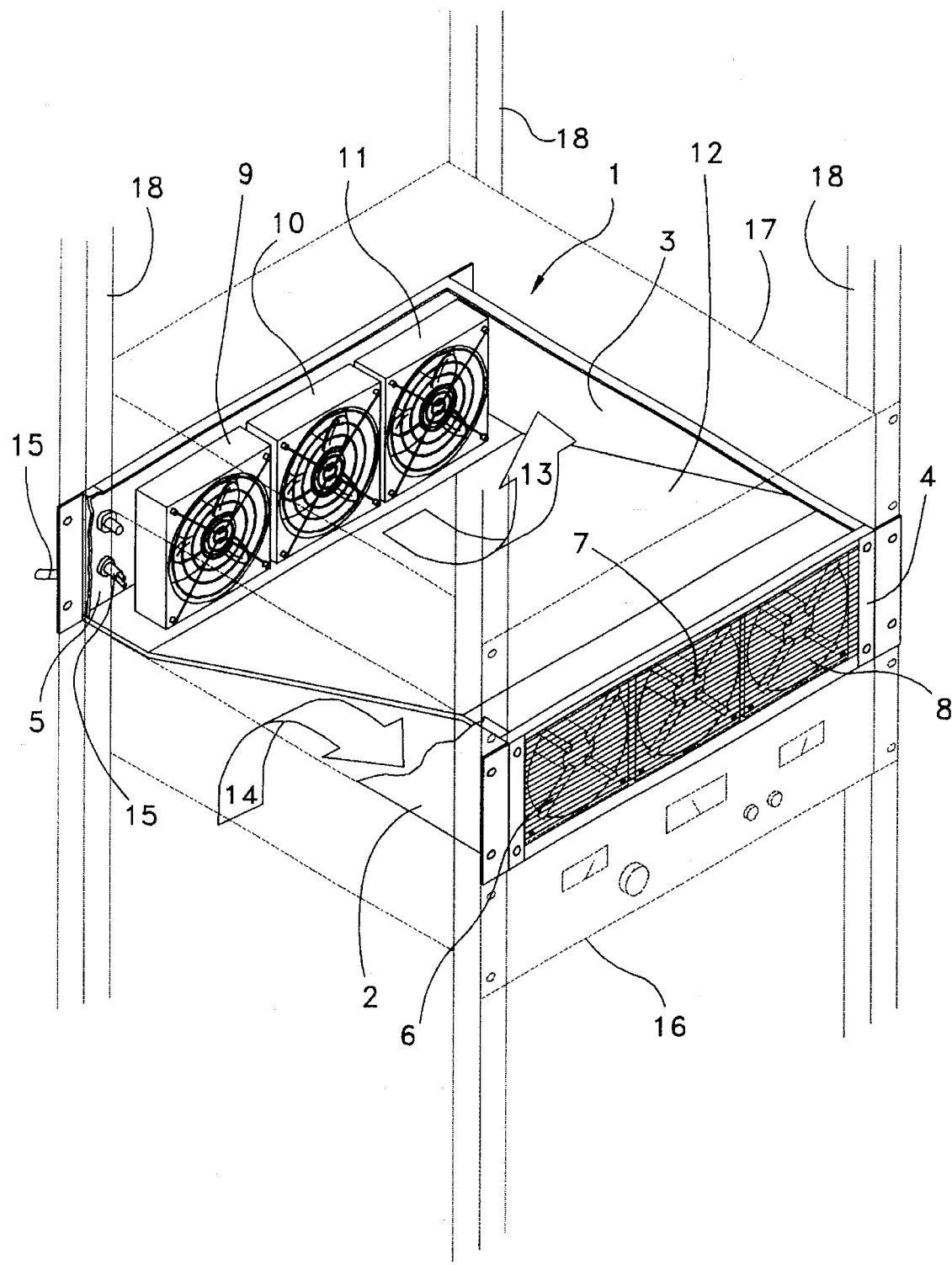
FIG. 1 is a sectioned perspective environmental view of a cooling device in accordance with one embodiment of the present invention.

FIG. 1 is a sectioned perspective environmental view of a cooling device in accordance with one embodiment of the present invention. FIG. 1 shows cooling device comprising an enclosure 1 having a top and bottom, both of which are opened to provide an air passage. Enclosure 1 also has lateral sides 2 and 3 (sectioned), from side 4 and rear side 5. From side 4 and rear side 5 each have three apertures each provided with a fans 6–8 and 9–11, respectively. Fans 6–8 are adapted to move air from inside the enclosure 1 to its outside, while fans 9–11 adapted to move air from outside the enclosure 1 to its inside. Air passing into the enclosure 1 through rear side fans 9–11 is directed upward through the top of the enclosure by deflector plate 12, as shown by directional arrow 13. Air passing into the enclosure 1 through its bottom is directed laterally through the fans 6–8 fit the front side of the enclosure 1 by deflector plate 12, as shown by directional arrow 14. Preferably deflector plate 12 should be of such material and of such thickness to sub substantially insulate air flow 13 from air flow 14.

FIG. 1 also shows power cords 15 (shown sectioned) which may be apportioned to supply power to fans 6–11.

FIG. 1 also shows how a cooling device in accordance with the present invention might be used in a vertical array of electronic components, such as one comprising lower component 16 and upper component 17 (shown in phantom). These components may be supported by a rack, cabinet or other supporting means, represented by supports 18.

Figure 2:
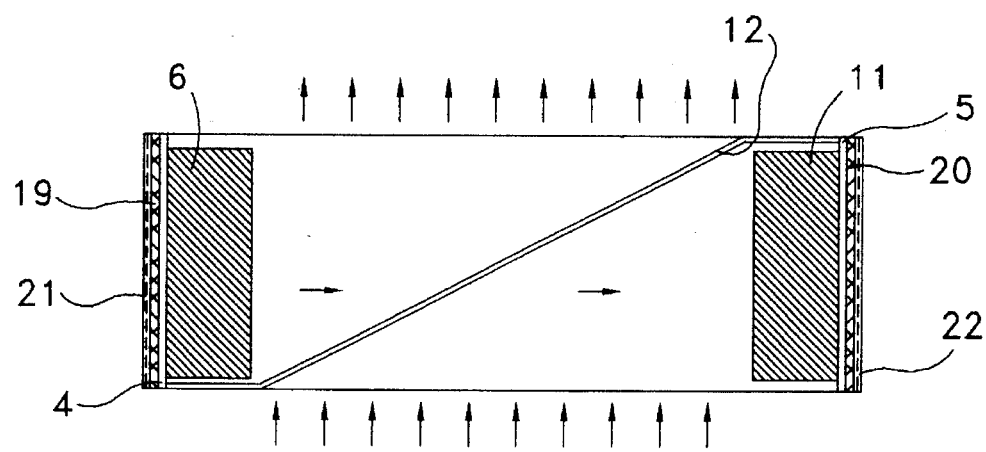
FIG. 2 is a cross-section elevational view of a cooling device in accordance with one embodiment of the present invention.

FIG. 2 is a cross-section elevational view of a cooling device in accordance with one embodiment of the present invention. FIG. 2 shows fans 6 and 11, deflector plate 12, and the front side 4 and rear side 5 of the enclosure. FIG. 2 also shows the direction of air flow through the cooling device, optional filters 19 and 20, and fan guards 21 and 22.

Figure 3:
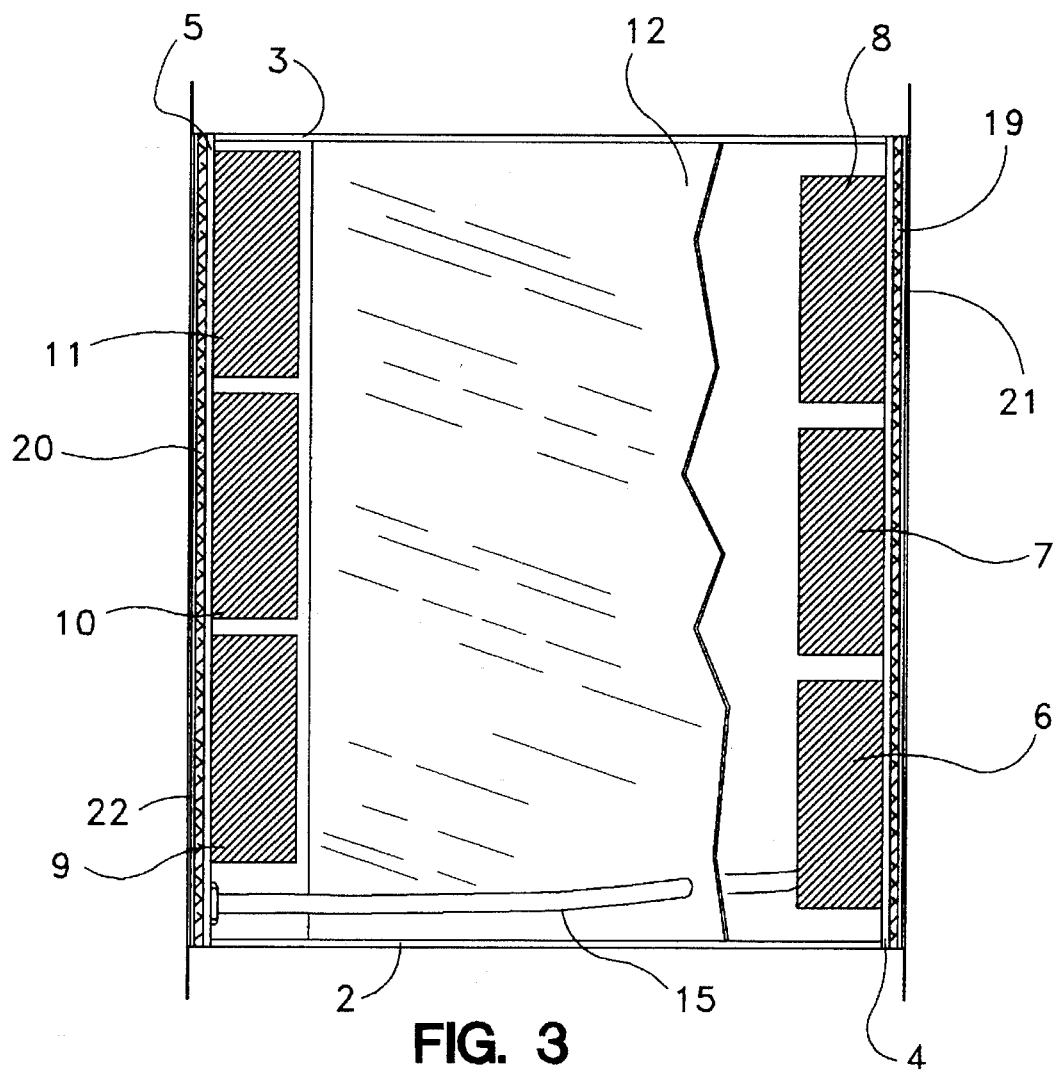
FIG. 3 is a top plan view of a cooling device in accordance with one embodiment of the present invention.

FIG. 3 is a top plan view of a cooling device in accordance with one embodiment of the present invention. FIG. 3 shows fans 6–8 and 9–11. Also shown are lateral sides 2 and 3, front side 4, and rear side 5 of the enclosure, and deflector plate 12. Filters 19 and 20, and fan guards 21 and 22 are also shown. FIG. 3 also shows how power cord 15 may extend through an aperture in deflector plate 12 to serve the fans on the other side.

Figure 4:
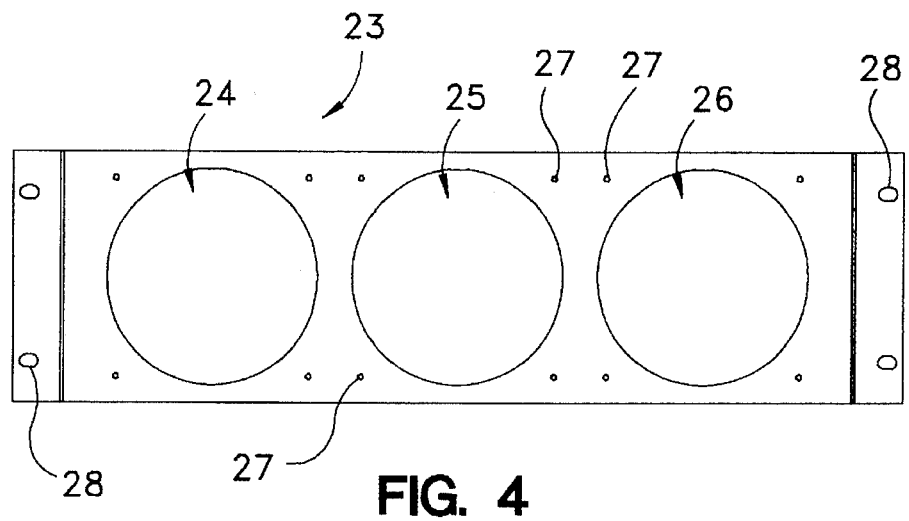
FIG. 4 is an elevational view of a side plate used in accordance with one embodiment of the present invention.

FIG. 4 shows an elevational view of plate 23 which may be used as the front and rear sides (items 3 and 4) of the enclosure. Plate 23 has apertures 24, 25 and 26, and fan-mounting holes, such as holes 27. Also shown are bracket-mounting holes 28.

Figure 5:
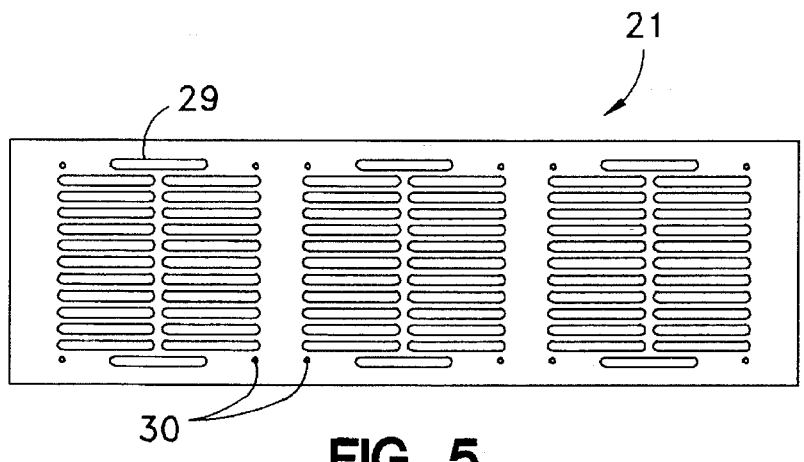
FIG. 5 is an elevational view of a fan guard used in accordance with one embodiment of the present invention.

FIG. 5 is an elevational view of from fan guard 21, having grate openings 29 and fan, mounting holes 30.

Figure 6:
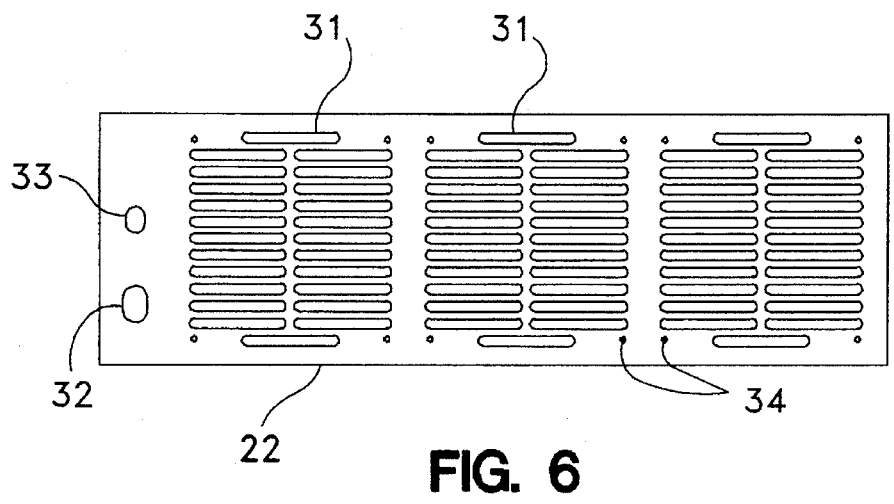
FIG. 6 is an elevational view of a fan guard used in accordance with one embodiment of the present invention.

FIG. 6 is an elevational view of rear fan guard 22, having gate openings 31, power cord access hole 32, fuse-mounting hole 33, and fan mounting holes 34.

Although not limited to specific dimensions, the cooling device of the embodiment shown. is about 16 inches wide, 19 inches in depth and about 5.2 inches in height. Naturally, the cooling device may be made in any dimension to be coextensive with the width and depth of the electronic devices with which it is associated.

In light of the foregoing disclosure, it will be within the ability of one skilled in the mechanical arts to make modifications to the present invention, such as through the substitution of equivalent materials and parts and the arrangement of parts, without departing from the spirit of the invention.

What is claimed is:

1. A vertical array of electronic devices having at least one cooling device, said array, mounted on a support and comprising:

(a) at least one upper electronic device;

(b) at least one lower electronic device; and (c) a cooling device disposed between said at least one upper electronic device and said at least one lower electronic device in said vertical array of electronic devices, said cooling device comprising:

(i) an enclosure having a top and a bottom, said top and bottom each having at least one opening, and having first and second opposing sides:

(ii) said first opposing side having at least one first aperture and at least one first than disposed in said at least one first aperture, said at least one first fan adapted to urge air toward the outside of said enclosure;

(iii) said second opposing side having at least one second aperture and at least one second fan disposed in said at least one second aperture, said second fan adapted to urge air toward the inside of said enclosure; and (iv) at least one deflector attached to said enclosure and positioned so as to direct air passing through said at least one opening in said bottom of said enclosure toward said at least one first fan, and to direct air passing through said at least one second fan toward said at least one opening in said top of said enclosure.

2. A vertical array of electronic devices having at least one cooling device according to claim 1 wherein said enclosure and said electronic devices have about the same width and depth dimensions.

* * * * *

UNITED STATES PATENT AND TRADEMARK OFFICE
CERTIFICATE OF CORRECTION

PATENT NO. : 5,528,454
DATED : June 18, 1996
INVENTOR(S) : John R. Niklos

It is certified that error appears in the above-indentified patent and that said Letters Patent is hereby corrected as shown below:

In column 4, line 12, please delete the " , " after "array".

In column 4, line 25, please delete the word "than" and replace it with -- fan -- .

Signed and Sealed this

Tenth Day of September, 1996

Attest:

BRUCE LEHMAN

*Attesting Officer*   *Commissioner of Patents and Trademarks*